(12) United States Patent
Moriwaki

(10) Patent No.: US 7,582,554 B2
(45) Date of Patent: Sep. 1, 2009

(54) METHOD FOR MANUFACTURING SEMICONDUCTOR DEVICE

(75) Inventor: Yoshikazu Moriwaki, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 0 days.

(21) Appl. No.: 11/798,734

(22) Filed: May 16, 2007

(65) Prior Publication Data

US 2007/0275553 A1 Nov. 29, 2007

(30) Foreign Application Priority Data

May 25, 2006 (JP) .............................. 2006-145331

(51) Int. Cl.
*H01L 21/4763* (2006.01)
(52) U.S. Cl. .............................. 438/618; 257/E21.433; 257/E21.435; 257/E21.44; 257/E21.507
(58) Field of Classification Search ................. 438/180, 438/184, 229, 301, 618; 257/332, 282, 387, 257/E21.433, E21.435, E21.438, E21.44, 257/E21.443, E21.507, E21.59
See application file for complete search history.

(56) References Cited

U.S. PATENT DOCUMENTS

| | | | | |
|---|---|---|---|---|
| 5,158,910 A * | 10/1992 | Cooper et al. | ................ | 438/631 |
| 5,308,792 A * | 5/1994 | Okabayashi et al. | ........ | 438/618 |
| 5,407,860 A * | 4/1995 | Stoltz et al. | ................. | 438/619 |
| 5,668,065 A * | 9/1997 | Lin | ............................. | 438/303 |
| 5,792,687 A * | 8/1998 | Jeng et al. | .................... | 438/253 |
| 6,054,769 A * | 4/2000 | Jeng | ........................... | 257/758 |
| 6,077,763 A * | 6/2000 | Chen et al. | ................... | 438/595 |
| 6,121,098 A * | 9/2000 | Strobl | ......................... | 438/301 |
| 6,153,476 A * | 11/2000 | Inaba et al. | ................. | 438/275 |
| 6,258,649 B1 * | 7/2001 | Nakamura et al. | .......... | 438/238 |
| 6,271,113 B1 * | 8/2001 | Yoon et al. | .................. | 438/618 |
| 6,310,374 B1 * | 10/2001 | Satoh et al. | ................. | 257/298 |
| 6,335,248 B1 * | 1/2002 | Mandelman et al. | ........ | 438/279 |
| 6,461,911 B2 * | 10/2002 | Ahn et al. | ................... | 438/253 |

(Continued)

FOREIGN PATENT DOCUMENTS

JP 8-31936 2/1996

(Continued)

OTHER PUBLICATIONS

Japanese Office Action dated May 14, 2008, with partial English translation.

*Primary Examiner*—N Drew Richards
*Assistant Examiner*—Ankush K Singal
(74) *Attorney, Agent, or Firm*—McGinn IP Law Group, PLLC

(57) ABSTRACT

A method for manufacturing a semiconductor device according to the present invention includes the steps of providing a semiconductor substrate in which an element isolation region and active regions surrounded by the element isolation region are formed, forming a plurality of conductive lines disposed such that the conductive lines cross the active regions, forming an insulating film over the entire surface including the conductive lines, and etching away the insulating film situated over the active regions between the conductive lines so as to form contact holes. After an anti-etching film is formed to protect the surfaces in the contact holes, wet etching is conducted to remove the insulating film in the contact holes so as to form the contact holes.

5 Claims, 19 Drawing Sheets

U.S. PATENT DOCUMENTS

| | | | | |
|---|---|---|---|---|
| 6,483,138 B1* | 11/2002 | Habu et al. | | 257/296 |
| 6,528,835 B1* | 3/2003 | Kaeriyama | | 257/296 |
| 6,608,356 B1* | 8/2003 | Kohyama et al. | | 257/412 |
| 6,683,342 B2* | 1/2004 | Lin | | 257/314 |
| 6,690,053 B2* | 2/2004 | Amo et al. | | 257/306 |
| 6,699,746 B2* | 3/2004 | Chung et al. | | 438/239 |
| 6,770,927 B2* | 8/2004 | Cho et al. | | 257/296 |
| 6,780,739 B1* | 8/2004 | Mao et al. | | 438/586 |
| 6,790,723 B2* | 9/2004 | Tanaka et al. | | 438/243 |
| 6,800,543 B2* | 10/2004 | Taguwa | | 438/592 |
| 6,858,934 B2* | 2/2005 | Tang et al. | | 257/755 |
| 6,873,010 B2* | 3/2005 | Chidambarrao et al. | | 257/329 |
| 6,927,170 B2* | 8/2005 | Zheng | | 438/702 |
| 7,030,029 B2* | 4/2006 | Tsuchiya | | 438/714 |
| 7,045,450 B2* | 5/2006 | Lee et al. | | 438/597 |
| 7,064,394 B2* | 6/2006 | Sugimae et al. | | 257/365 |
| 7,094,672 B2* | 8/2006 | Chen et al. | | 438/586 |
| 7,141,511 B2* | 11/2006 | Manning | | 438/740 |
| 7,166,889 B2* | 1/2007 | Tsunoda et al. | | 257/321 |
| 7,309,891 B2* | 12/2007 | Yaegashi et al. | | 257/314 |
| 7,329,918 B2* | 2/2008 | Cho et al. | | 257/303 |
| 2001/0005614 A1* | 6/2001 | Kim et al. | | 438/284 |
| 2001/0055867 A1* | 12/2001 | Lee | | 438/586 |
| 2002/0081799 A1* | 6/2002 | Kim | | 438/233 |
| 2003/0157757 A1* | 8/2003 | Kumauchi et al. | | 438/197 |
| 2003/0211673 A1* | 11/2003 | Nakamura et al. | | 438/197 |
| 2003/0216004 A1* | 11/2003 | Jeong et al. | | 438/279 |
| 2004/0063313 A1* | 4/2004 | Shiratake et al. | | 438/672 |
| 2004/0171247 A1* | 9/2004 | Cho et al. | | 438/622 |
| 2004/0175908 A1* | 9/2004 | Ikematsu et al. | | 438/592 |
| 2004/0198008 A1* | 10/2004 | Tsai et al. | | 438/301 |
| 2004/0209427 A1* | 10/2004 | Huang et al. | | 438/262 |
| 2004/0229451 A1* | 11/2004 | Yang | | 438/592 |
| 2005/0095834 A1* | 5/2005 | Lee et al. | | 438/597 |
| 2005/0158949 A1* | 7/2005 | Manning | | 438/253 |
| 2005/0237847 A1* | 10/2005 | Goda et al. | | 365/230.06 |
| 2005/0266634 A1* | 12/2005 | Park et al. | | 438/238 |
| 2006/0118886 A1* | 6/2006 | Tsai et al. | | 257/382 |
| 2006/0154460 A1* | 7/2006 | Yun et al. | | 438/586 |
| 2007/0001212 A1* | 1/2007 | Lee et al. | | 257/315 |
| 2007/0012991 A1* | 1/2007 | Yaegashi | | 257/315 |
| 2007/0215930 A1* | 9/2007 | Machida et al. | | 257/314 |

FOREIGN PATENT DOCUMENTS

| | | |
|---|---|---|
| JP | 10-065002 | 3/1998 |
| JP | 10-289951 | 10/1998 |
| JP | 2001-230383 | 8/2001 |

* cited by examiner

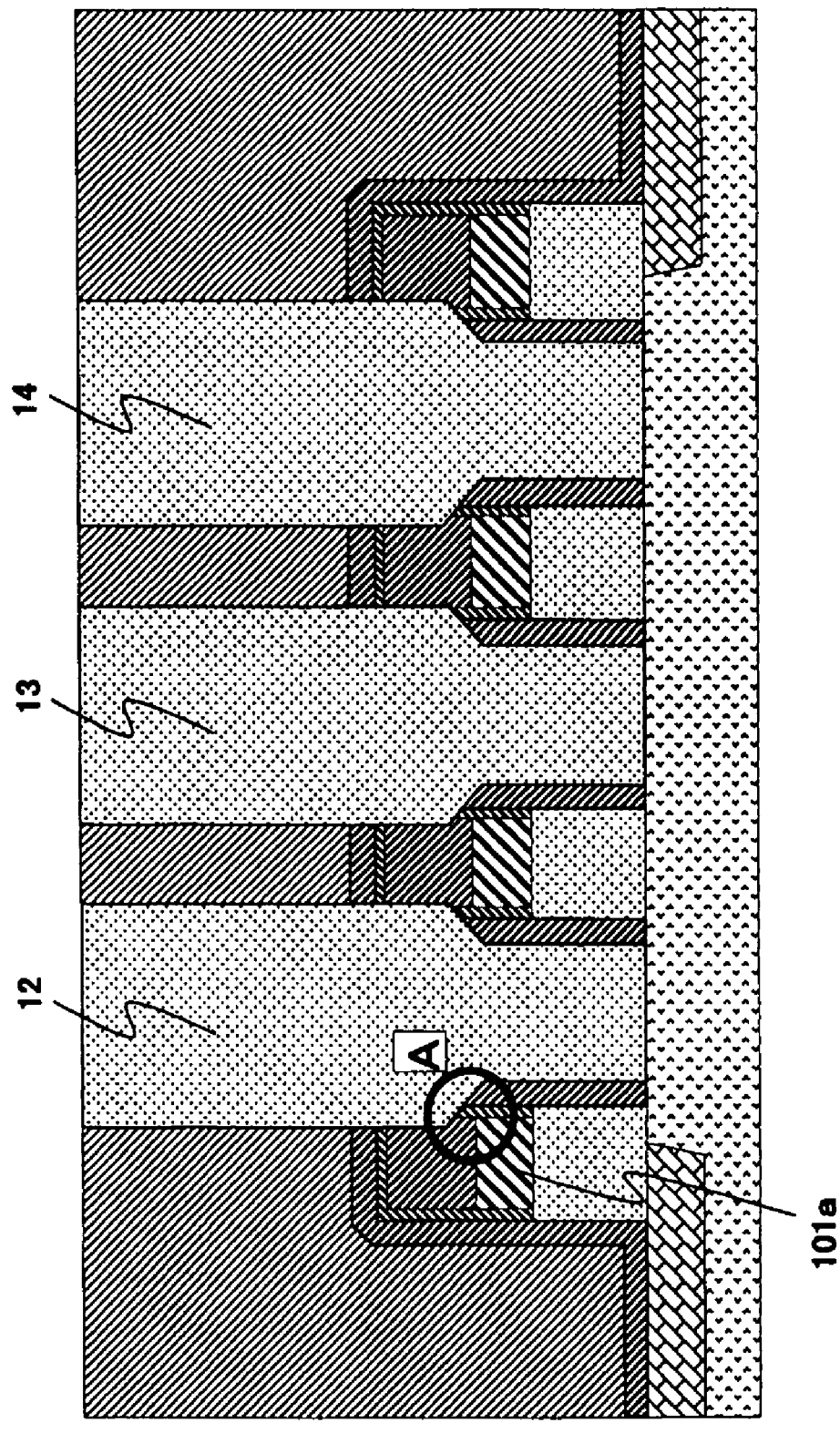

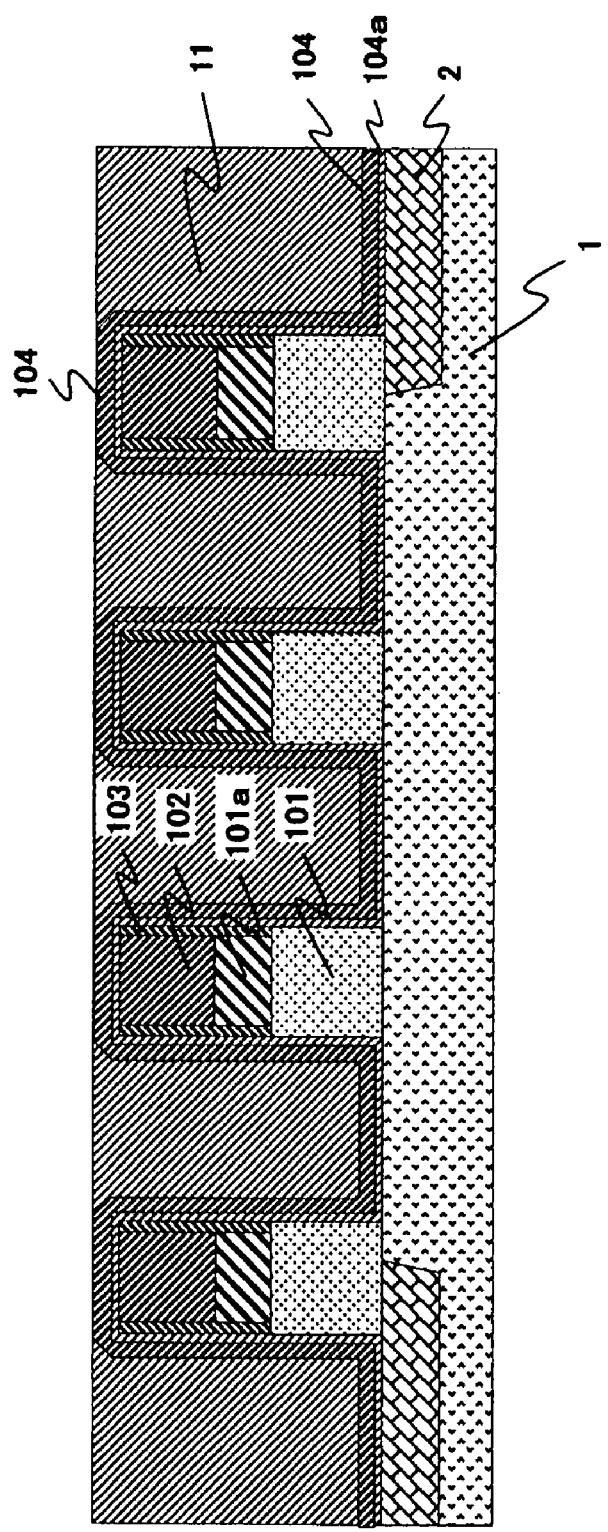
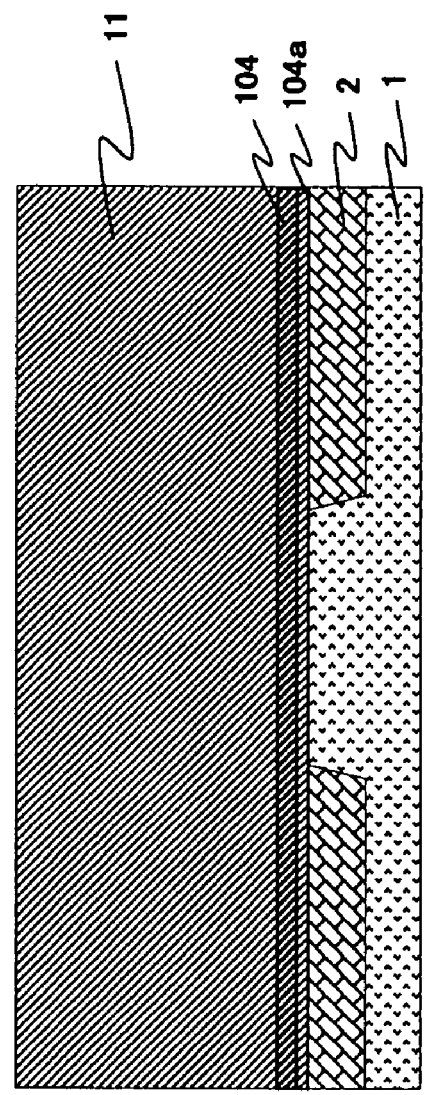
FIG. 7A
FIG. 7B

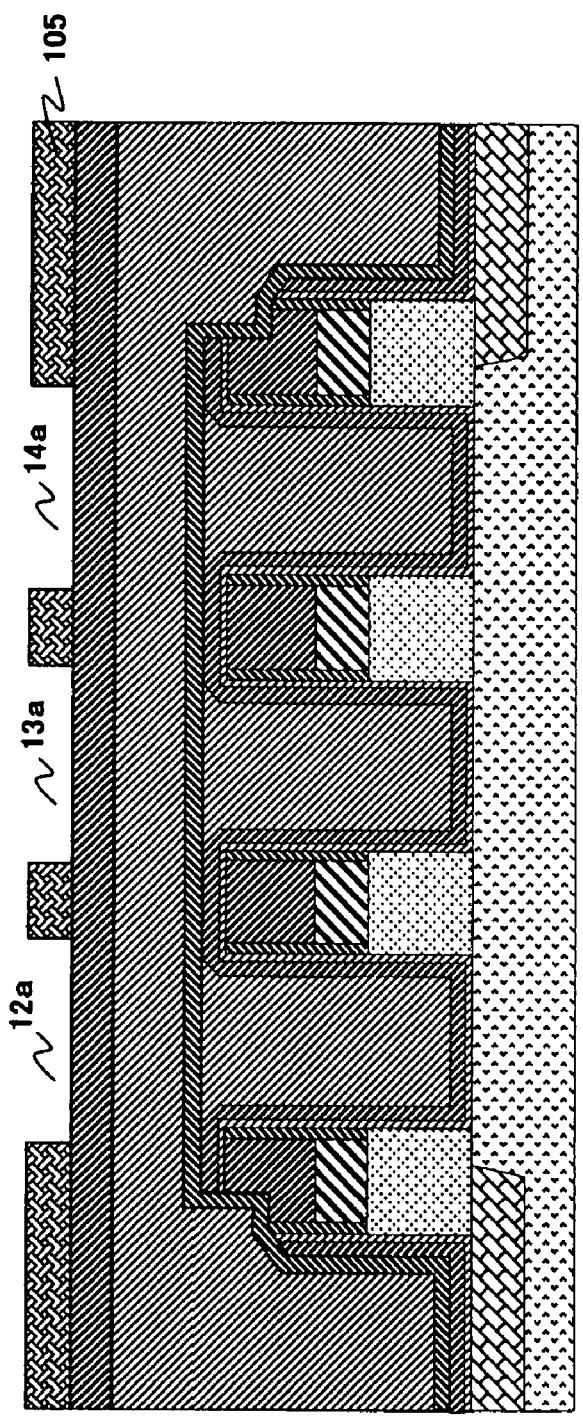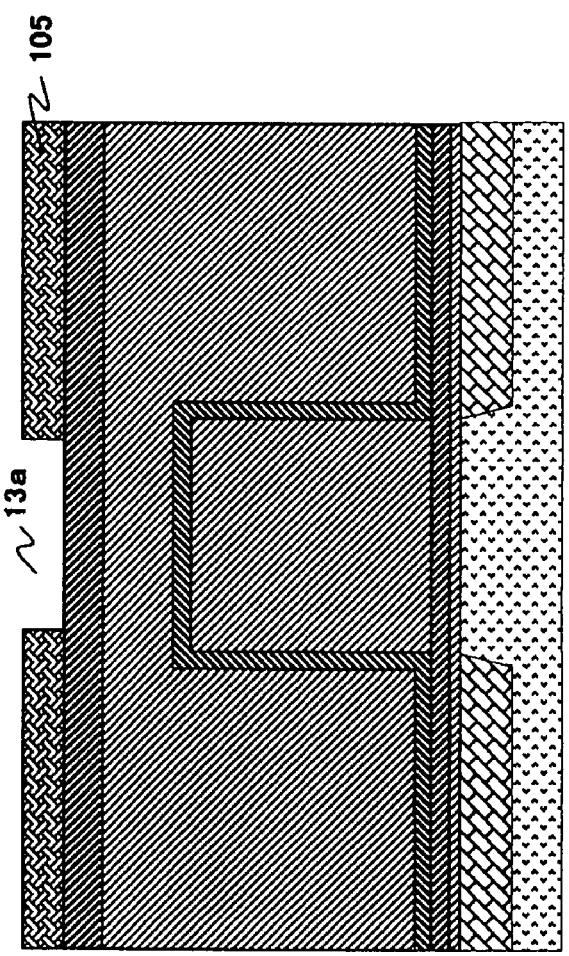
FIG. 13A
FIG. 13B

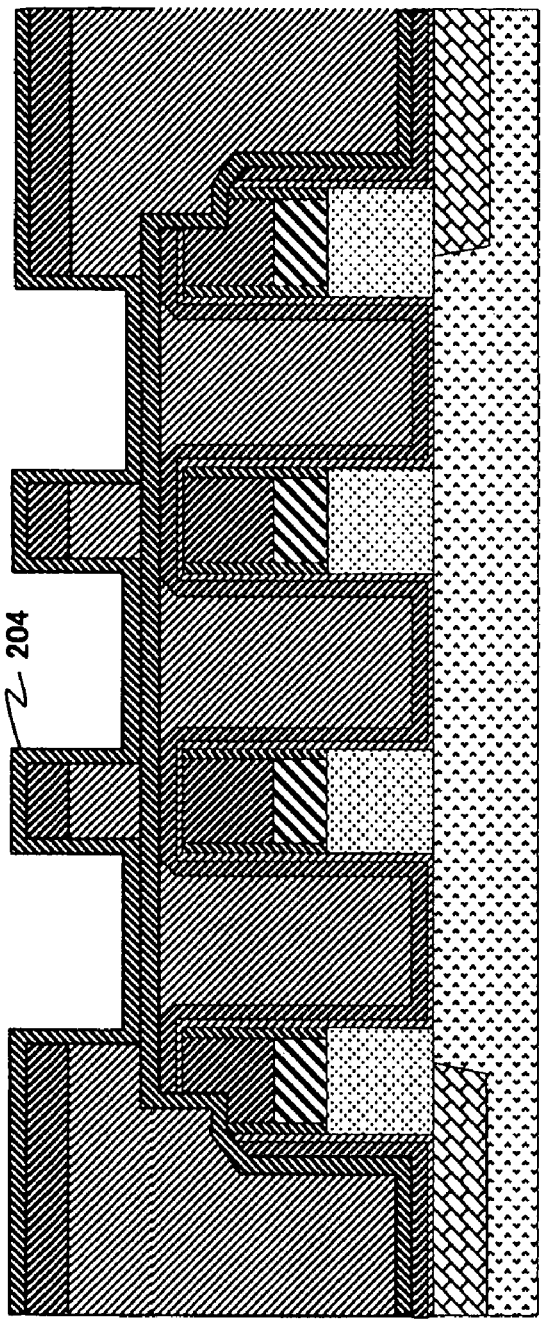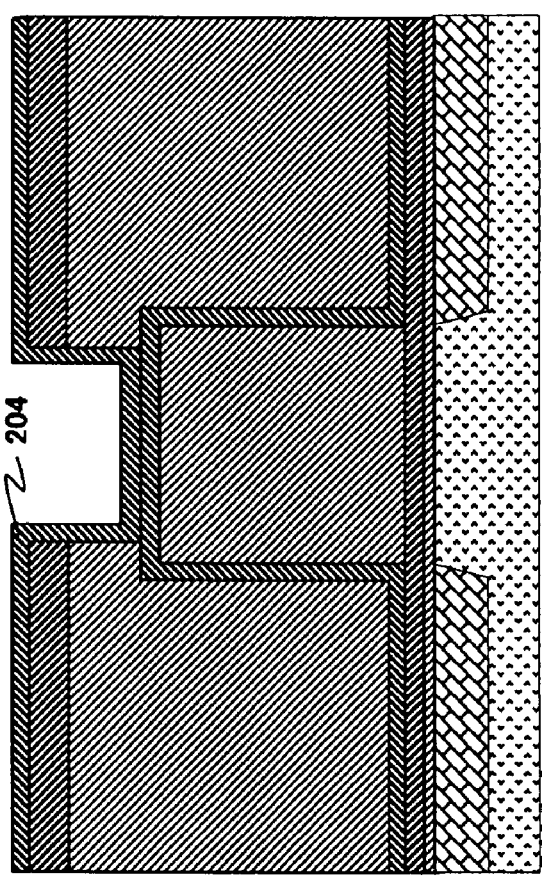
FIG. 15A
FIG. 15B

METHOD FOR MANUFACTURING SEMICONDUCTOR DEVICE

BACKGROUND OF THE INVENTION

1. Field of the Invention

The present invention relates to a method for manufacturing a semiconductor device, and particularly to a method for manufacturing a semiconductor device suitable for forming a contact hole in a DRAM (Dynamic Random Access Memory) memory cell.

2. Description of the Related Art

Firstly, an example of a method for manufacturing a DRAM will be schematically described with reference to the cross-sectional view shown in FIG. 1.

An insulating film is buried in a predetermined region in a semiconductor substrate 1 made of silicon to form an element isolation region 2. Then, transistors formed of gate insulating films 3, gate electrodes 5, 6 and impurity diffusion layers 9, 10 are formed. Gate electrodes form word lines 4, 5, 6 and 7. After each of the word lines is covered with an insulating film 8, an interlayer insulating film 11 is formed. Then, contact plugs 12, 13 and 14 connected to the impurity diffusion layers 9, 10 are formed in the interlayer insulating film 11. After an interlayer insulating film 15 is formed over the surface, a bit line contact plug 16 connected to the contact plug 13 is formed and a bit line 17 connected to the bit line contact plug 16 is formed. After an interlayer insulating film 18 is formed over the bit line, capacitance contact plugs 19 are formed through the interlayer insulating films 15 and 18 such that the capacitance contact plugs 19 are connected to the contact plugs 12 and 14. Then, a silicon nitride film 20 and a silicon oxide film 21 are formed, and deep holes are formed such that the capacitance contact plugs 19 are exposed. A lower electrode 22, a capacitance insulating film 23 and an upper electrode 24 that form a capacitor are formed in each of the deep holes. Thereafter, formation of another interlayer insulating film and formation of wiring is repeated to complete a DRAM element.

In recent years, as the degree of integration increases, the dimensions of lines and spaces of wiring and the diameters of contact holes decrease, resulting in considerable difficulty in processing wiring and contact holes. Among others, in forming the contact plugs 12, 13 and 14 shown in FIG. 1, a SAC (Self Aligned Contact) method has been used to achieve easier processing. The SAC method is described in Japanese Patent Laid-Open No. 2001-230383, No. 10-289951 and No. 10-65002. However, even when the SAC method is used to form the contact hole, the shoulder of the insulating film 8 is scraped, resulting in a serious problem of short circuit between the contact plug and the word line.

This short circuit problem of prior art will be described in more detail with reference to FIGS. 2 to 6. FIG. 2 is a plan view of the memory cell corresponding to FIG. 1, and FIGS. 3 to 6 are a series of cross-sectional views in the order of processing steps.

Firstly, the plan view of FIG. 2 will be described. The word lines 4, 5, 6 and 7 have been formed in the vertical direction such that the word lines cross active regions surrounded by the element isolation region 2. The portions between the word lines in the active regions correspond to the impurity diffusion layers 9, 10. The circles 12a, 13a and 14a indicate the positions of the contact plugs 12, 13 and 14 that overlie the positions where the impurity diffusion layers are formed. FIGS. 1 and 3 to 6 are cross-sectional views corresponding to the cross section taken along the line X-X shown in FIG. 2.

Next, a conventional method for forming contact plugs will be described with reference to a series of cross-sectional views of FIGS. 3 to 6.

Firstly, as shown in FIG. 3, after the word lines 4, 5, 6 and 7 are formed, the interlayer insulating film 11 is formed thereon. Specifically, the word line is formed of a polycrystalline silicon film 101, a tungsten film 101a, a silicon nitride film 102 and a silicon nitride film 103 that is formed in such a way that it surrounds the silicon nitride film 102 and the tungsten film 101a. A silicon nitride film 104 is formed over the surface including the word lines. The interlayer insulating film 11 formed of a silicon oxide film is further formed, and CMP (Chemical Mechanical Polishing) method is used to planarize the surface of the interlayer insulating film 11. In this description, the gate insulating film is omitted.

Then, as shown in FIG. 4, lithography is used to form a photoresist 105 as well as aperture patterns 12a, 13a and 14a corresponding to contact hole patterns in the photoresist 105. These aperture patterns correspond to the positions of the contact plugs 12a, 13a and 14a shown in FIG. 2.

Thereafter, as shown in FIG. 5, dry etching using the photoresist 105 as a mask is conducted to form contact holes 109. The etching of the interlayer insulating film 11 formed of a silicon oxide film is carried out by using fluorine-containing gas plasma. In this process, the etching rate of the silicon oxide film can be on the order of three times the etching rate of the silicon nitride film at maximum, so that the silicon nitride films 104, 103 and 102 are also disadvantageously etched during the etching of the interlayer insulating film 11. The ratio of the etching rates shows a material-specific characteristic in dry etching, so that it is difficult to greatly change the characteristic even when the condition of the gas plasma is changed.

Then, as shown in FIG. 6, after a polycrystalline silicon film is formed such that the contact holes 109 are filled, the polycrystalline silicon film is etched back to form the contact plugs 12, 13 and 14 in the contact holes 109. Consequently, as described above, the silicon nitride film at the shoulder of the word line has been etched during the formation of the contact hole, resulting in reduced thickness of the insulating film between the contact plug and the tungsten 101a that forms the word line and hence a possibility of short circuit. If short circuit occurs, the DRAM will not operate.

Patent Documents associated with the formation of the contact holes described above include Japanese Patent Laid-Open No. 2001-230383, No. 10-289951 and No. 10-65002.

As described above, the method for forming a contact hole by using dry etching reduces the thickness of the insulating film at the portion indicated by the circle A in FIG. 6, resulting in difficulty in preventing the short circuit between the contact plug and the word line. To ensure the normal operation of the DRAM, there is a desire to develop a method for forming a contact hole in which sufficient thickness of the insulating film between the contact plug and the word line is provided to prevent short circuit.

SUMMARY OF THE INVENTION

An object of the present invention is to provide a method for manufacturing a semiconductor device in which a sufficiently thick film thickness of an insulating film is left between a contact plug and a conductive line such as a word line to prevent short circuit when a contact hole is formed.

According to the present invention, there is provided a method for manufacturing a semiconductor device including the steps of:

providing a semiconductor substrate in which an element isolation region and active regions surrounded by the element isolation region are formed;

forming a plurality of conductive lines disposed such that the conductive lines cross the active regions;

forming a first insulating film over the entire surface including the conductive lines; and etching away the first insulating film situated over the active regions between the conductive lines so as to form contact holes, wherein after an anti-etching film is formed to protect the surfaces in the contact holes, wet etching is conducted to remove the first insulating film in the contact holes so as to form the contact holes.

The manufacturing method described above can further include the step of:

after the conductive lines are formed and before the first insulating film is formed, forming a first silicon nitride film over the entire surface including the conductive lines, the active regions and the element isolation region;

after the first insulating film is formed, removing the first insulating film until the surfaces of the first silicon nitride films situated over the top surfaces of the conductive lines are exposed;

after the step of removing the first insulating film until the surfaces of the first silicon nitride films are exposed, forming a first resist mask including resist portions that are formed such that the resist portions are separately disposed corresponding to the active regions and cover contact hole formation regions in the active regions, removing the first insulating film over the element isolation region by dry etching using the first resist mask;

after the first resist mask is removed, forming a second silicon nitride film over the entire surface;

forming a second insulating film over the second silicon nitride film and planarizing the surface of the second insulating film;

forming a third silicon nitride film on the planarized second insulating film;

forming a second resist mask having openings disposed at predetermined positions over the active regions;

dry etching the third silicon nitride film and the second insulating film using the second resist mask to form first contact holes and expose the surface of the second silicon nitride film in the holes;

after the second resist mask is removed, forming a fourth silicon nitride film over the entire surface;

dry etching the fourth silicon nitride film and the second silicon nitride film situated at the bottoms of the first contact holes to expose the surface of the first insulating film in the holes;

removing the first insulating film whose surface is exposed in the first contact holes by wet etching so as to form second contact holes that are situated under the first contact holes and communicate therewith; and dry etching the first silicon nitride film exposed at the bottoms of the second contact holes so as to expose the surfaces of the active regions.

In the manufacturing method described above, the step of removing the first insulating film until the surface of the first silicon nitride film is exposed can be carried out by polishing to planarize the surface of the first insulating film.

In the manufacturing method described above, the first resist mask can have the same pattern as the pattern of the active regions and is disposed such that the first resist mask overlies the pattern of the active regions.

In the manufacturing method described above, the diameters of the openings in the second resist mask for forming the first contact holes may be smaller than the length of the first resist mask in the direction perpendicular to the longitudinal direction.

The manufacturing method described above can further include the step of filling the first contact holes and the second contact holes with conductive material to form contact plugs.

In the present invention, since wet etching is used to remove the insulating film necessary for contact hole formation, it is possible to significantly increase (for example, about 100 times) the etching rate of the insulating film, such as a silicon oxide film and a BPSG film, with respect to the etching rate of the anti-etching film, such as a silicon nitride film. Therefore, the insulating film formed of a silicon oxide film, a BPSG film or the like can be selectively removed substantially without etching the conductive line-protecting, anti-etching film, such as a silicon nitride film. As a result, it is possible to prevent short circuit between the contact plugs and the conductive lines such as word lines.

BRIEF DESCRIPTION OF THE DRAWINGS

FIG. 6 is a cross-sectional view of the process subsequent to FIG. 5 and explains the problem of prior art;

FIG. 7A is a cross-sectional view taken along the direction X-X in the plan view of FIG. 9 and explains how to form contact plugs according to the present invention;

FIG. 7B is a cross-sectional view taken along the direction Y-Y in the plan view of FIG. 9 and explains how to form contact plugs according to the present invention;

FIG. 13A is a cross-sectional view taken along the direction X-X subsequent to FIG. 12A and explains how to form contact plugs according to the present invention;

FIG. 13B is a cross-sectional view taken along the direction Y-Y subsequent to FIG. 12B and explains how to form contact plugs according to the present invention;

FIG. 15A is a cross-sectional view taken along the direction X-X subsequent to FIG. 14A and explains how to form contact plugs according to the present invention;

FIG. 15B is a cross-sectional view taken along the direction Y-Y subsequent to FIG. 14B and explains how to form contact plugs according to the present invention;

DETAILED DESCRIPTION OF THE PREFERRED EMBODIMENTS

Figure 1:
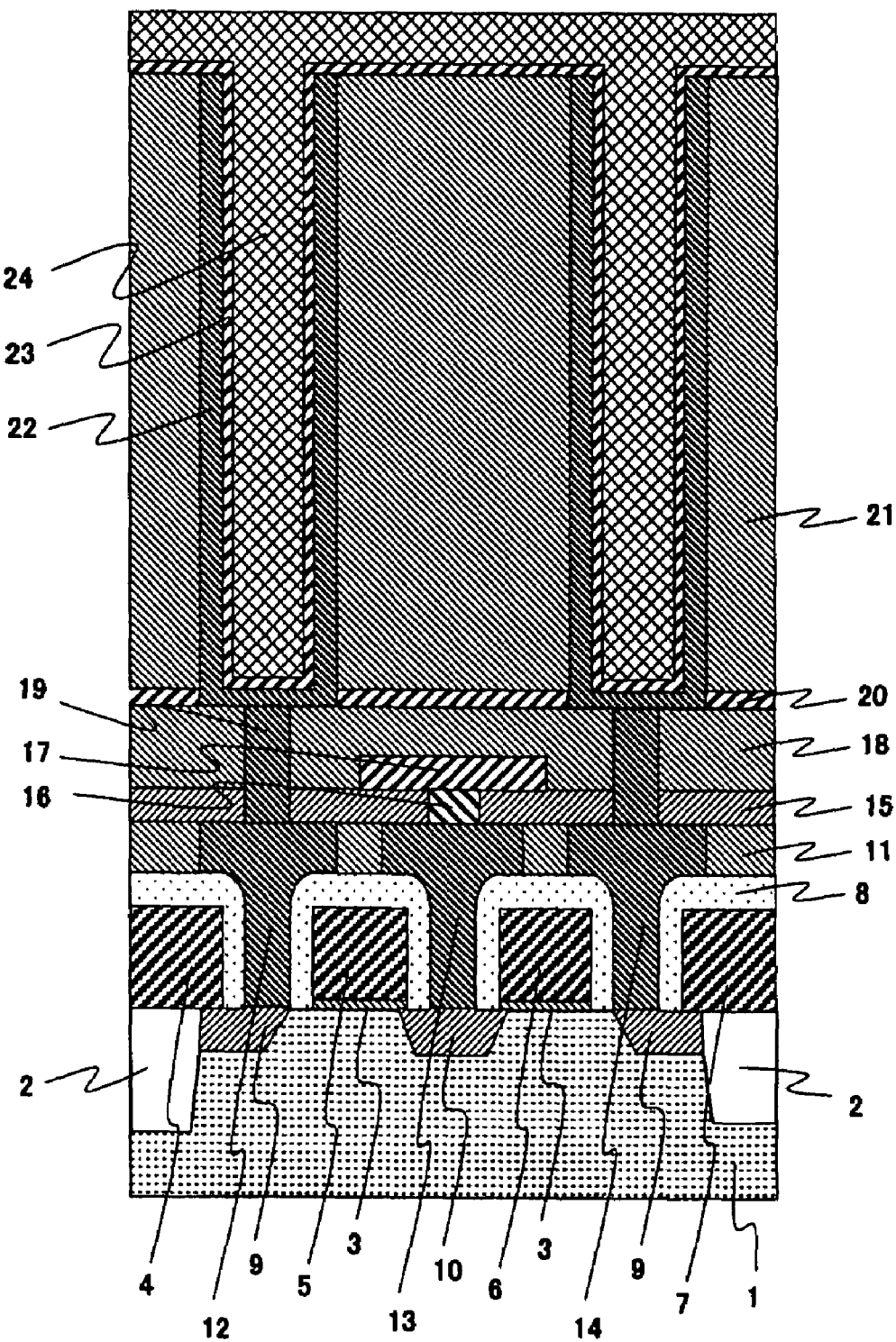
FIG. 1 is a cross-sectional view for explaining the configuration of a DRAM.

An embodiment of the present invention will be described below in detail with reference to the cross-sectional views of FIGS. 7A to 8B, the plan view of FIG. 9 and a series of cross-sectional views of FIGS. 10A to 19B. FIGS. 7A, 8A, 10A, 11A, 12A, 13A, 14A, 15A, 16A, 17A, 18A and 19A show the cross section taken along the line X-X shown in the plan view of FIG. 9. FIGS. 7B, 8B, 10B, 11B, 12B, 13B, 14B, 15B, 16B, 17B, 18B and 19B show the cross section taken along the line Y-Y shown in the plan view of FIG. 9.

Firstly, as shown in FIG. 7A, a known method is used to form an element isolation region 2 in a predetermined region in the surface of a semiconductor substrate 1 made of p-type monocrystalline silicon. After thermal oxidation is used to form a 4 nm-thick gate oxide film (not shown in the figure) on the surface of the semiconductor substrate, known CVD (Chemical Vapor Deposition) using monosilane ($SiH_4$) as raw material gas is used to deposit a polycrystalline silicon film 101. The thickness of the polycrystalline silicon film 101 is 100 nm. Then, known sputtering is used to deposit a 70 nm-thick tungsten film 101 a, and known plasma CVD using monosilane and ammonium ($NH_3$) as raw material gas is used to deposit a 140 nm-thick silicon nitride film 102. Thereafter, lithography and dry etching are used to etch and pattern the silicon nitride film 102 and the tungsten film 101a and expose the polycrystalline silicon film 101. The etching of the silicon nitride film 102 and the tungsten film 101a is carried out by using fluorine-containing plasma and chlorine-containing plasma, respectively.

Then, known CVD using dichlorosilane ($SiH_2Cl_2$) and ammonium as raw material gas is used to deposit a 15 nm-thick silicon nitride film 103. Furthermore, dry etching is used to etch back the silicon nitride film 103 so as to form sidewall layers formed of the silicon nitride film 103 on the sidewalls of the silicon nitride film 102 and the tungsten film 101a. This etch back process exposes the polycrystalline silicon film 101 in the area where there is no tungsten film 101a.

Thereafter, chlorine-containing gas plasma is used to dry etch the exposed polycrystalline silicon film 101 so as to form word lines formed of the polycrystalline silicon film 101, the tungsten film 101a and the silicon nitride films 102 and 103. At this point, ion implantation may be used to form an impurity diffusion layer on the surface of the semiconductor substrate. It is noted that a tungsten nitride film is desirably formed as a barrier layer on the surface of the silicon film 101 before the tungsten film 101a is formed.

Figure 2:
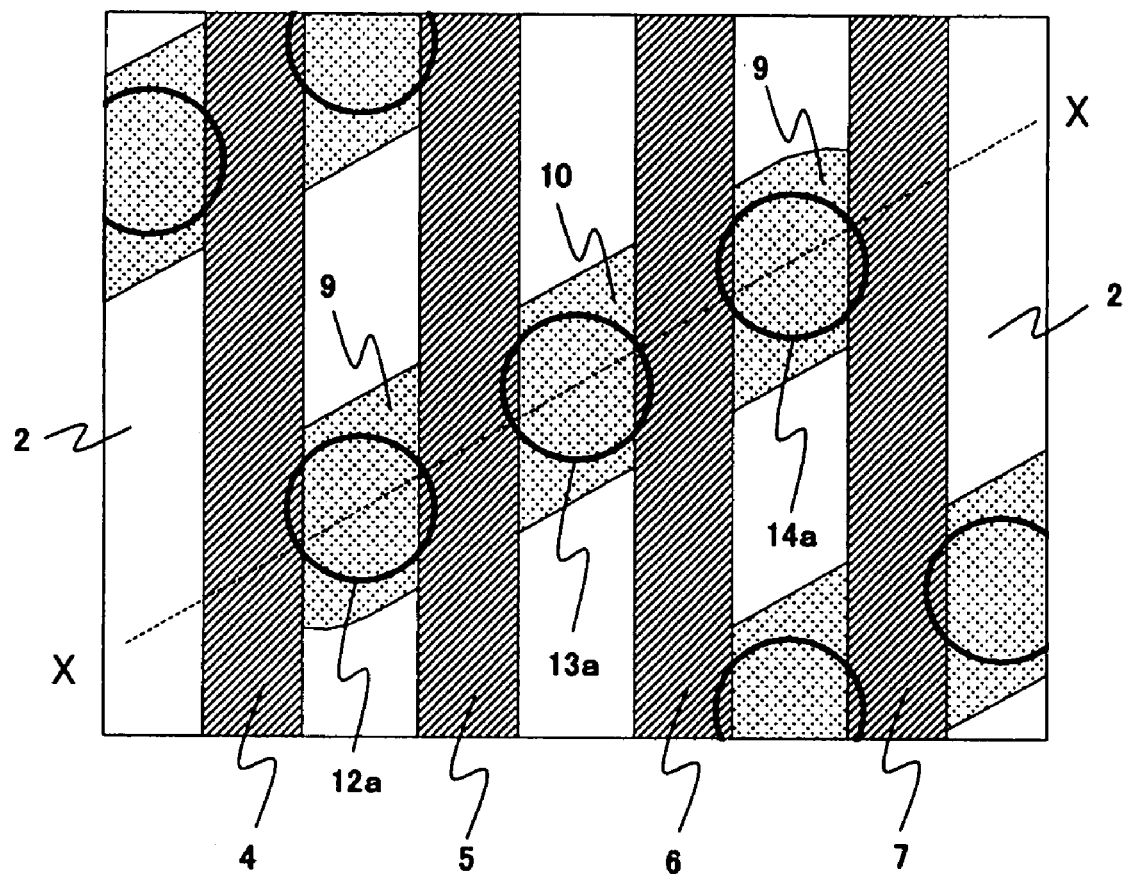
FIG. 2 is a plan view for explaining the positions of the contact holes shown in FIG. 1.
Figure 3:
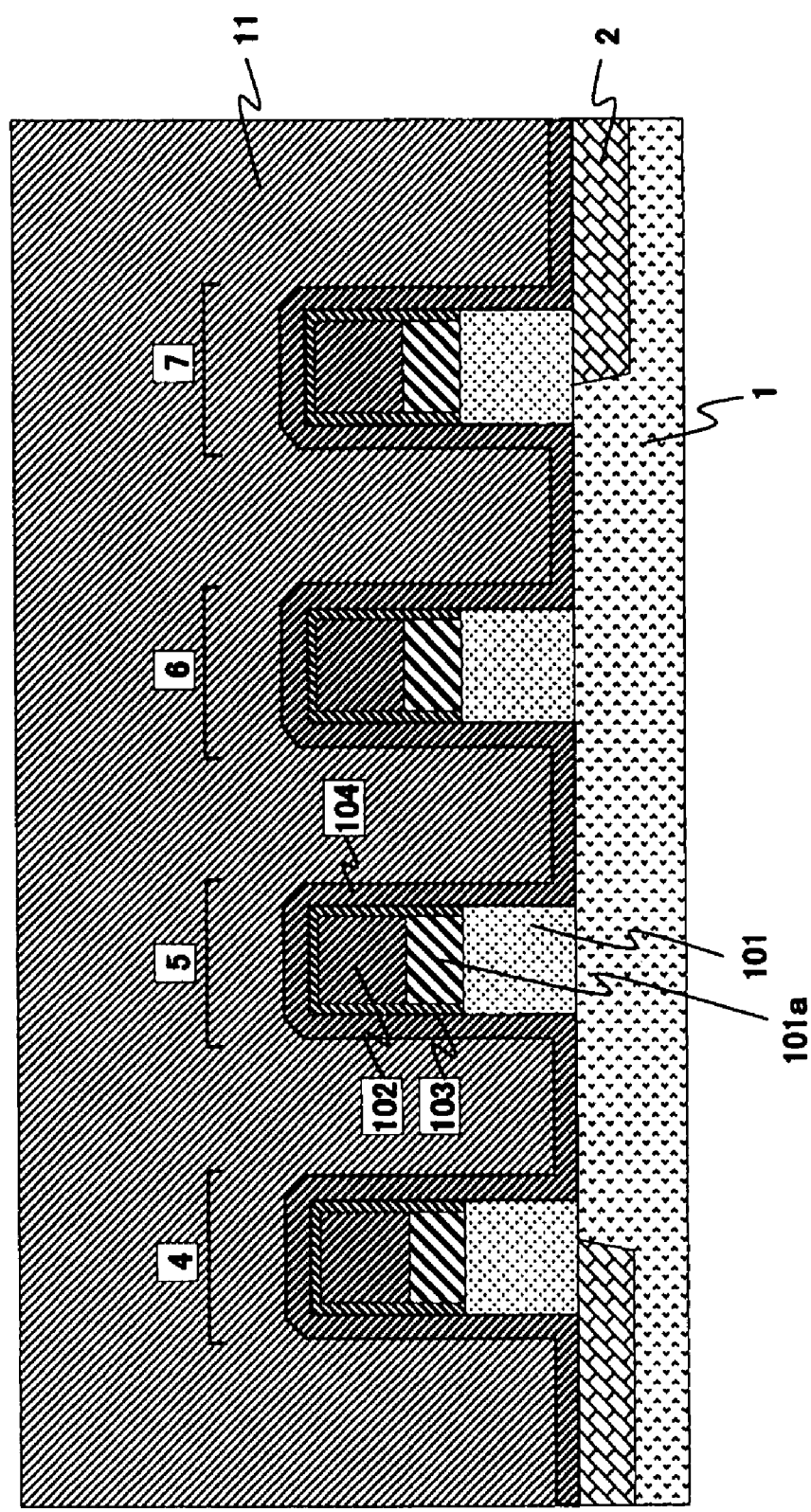
FIG. 3 is a cross-sectional view taken along the line X-X in FIG. 2 before the contact holes are formed and explains a problem of prior art.
Figure 4:
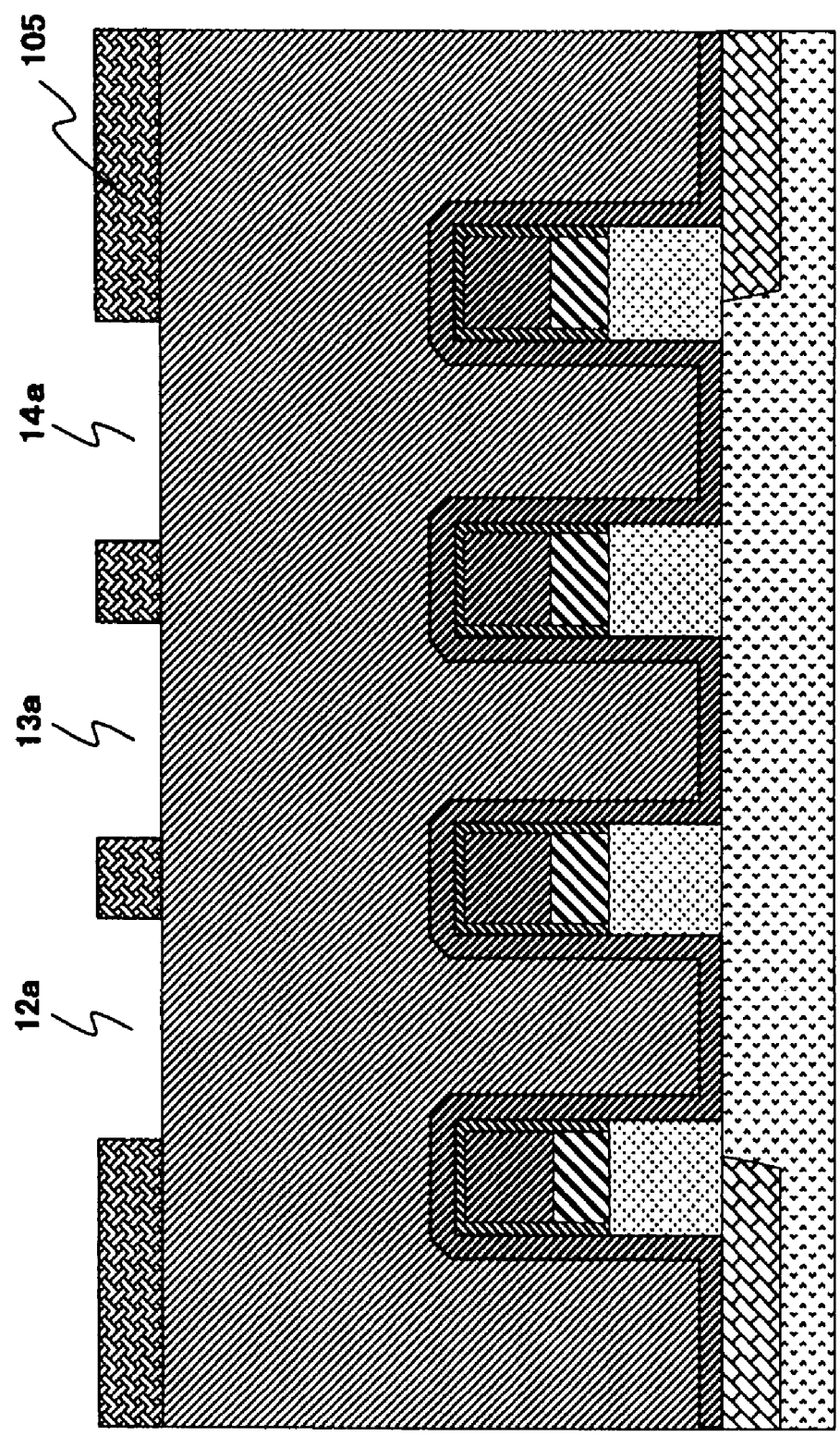
FIG. 4 is a cross-sectional view of the process subsequent to FIG. 3 and explains the problem of prior art.
Figure 5:
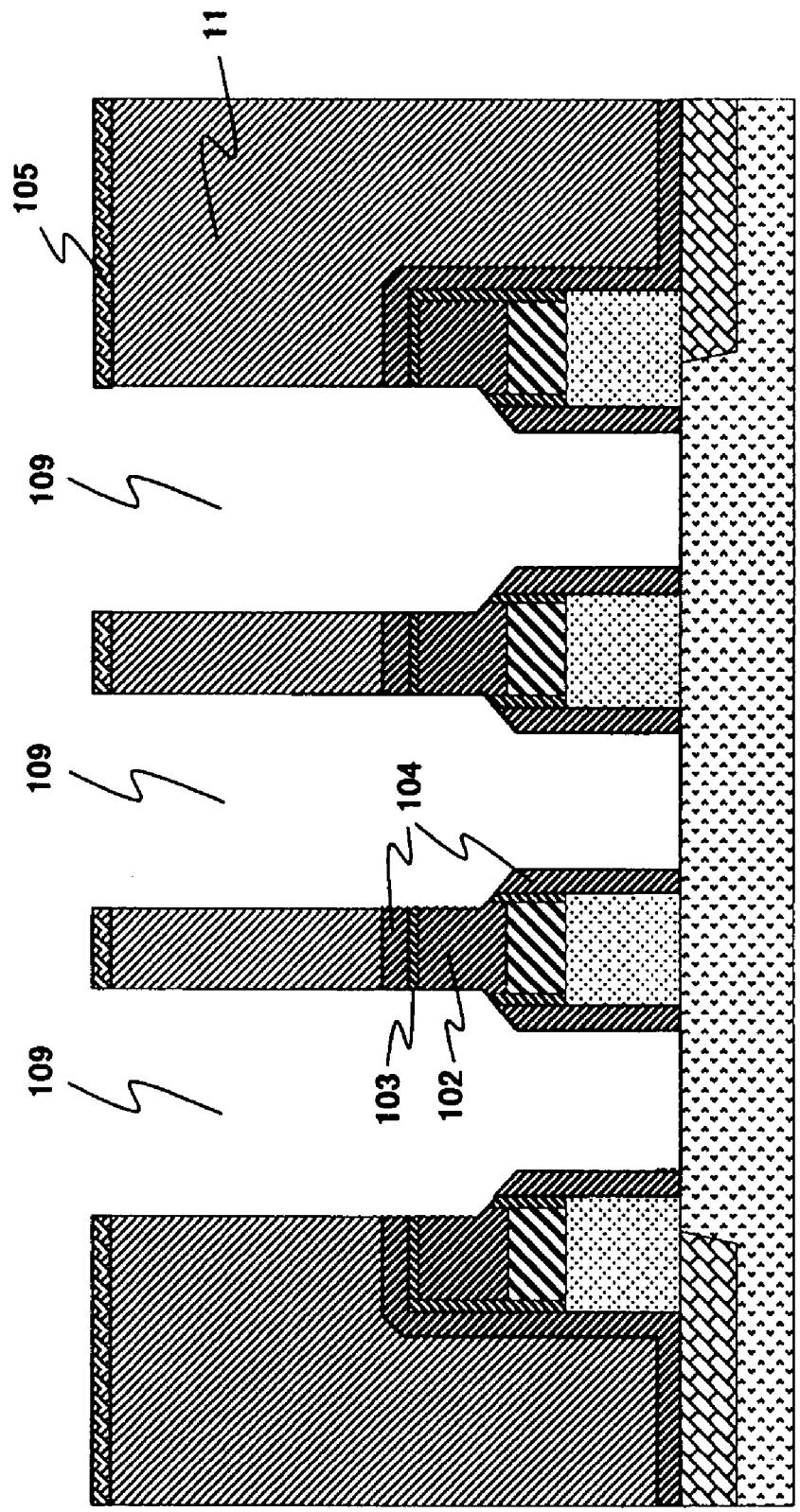
FIG. 5 is a cross-sectional view of the process subsequent to FIG. 4 and explains the problem of prior art.

The word lines have been disposed along the vertical direction such that they cross active regions surrounded by the element isolation region 2, as in the structure shown in FIG. 2. In each of the active regions, impurity diffusion layers 9 and 10 are provided between the word lines that cross the active region. In this embodiment, first contact holes are formed at the positions indicated by the circles 12a, 13a and 14a in FIG. 2.

After the word lines are formed, known CVD using tetraethoxysilane ($Si(OC_2H_5)_4$) as raw material gas is used to deposit a 7 nm-thick silicon oxide film 104a over the surface, and plasma CVD is used to further deposit a 30 nm-thick first silicon nitride film 104 over the surface.

Then, a 600 nm-thick insulating film 11 made of BPSG (Boro-Phospho Silicate Glass) is formed such that the insulating film 11 covers all word lines. The BPSG is deposited by known plasma CVD using tetraethoxysilane, triethoxyboron ($B(OC_2H_5)_3$) and triethoxyphosphine ($P(OC_2H_5)_3$) as raw material gas as well as using ozone as an oxidant. Then, the resultant structure undergoes heat treatment in a steam atmosphere at 750° C. to fluidize and planarize the surface of the structure. Thereafter, CMP (Chemical Mechanical Polishing) method is used to polish the insulating film 11 until the surface of the first silicon nitride film 104 is exposed. At this point, the silicon oxide film 104a, the first silicon nitride film 104 and the silicon oxide film 11 are present on the semiconductor substrate 1 as shown in the cross section taken along the direction Y-Y shown in FIG. 7B. It is noted that after the silicon oxide film 104a is formed or after the first silicon nitride film 104 is formed, ion implantation is used to form an impurity diffusion layer on the surface of the semiconductor substrate. Instead of the silicon oxide film 104a, a silicon oxynitride film may be formed. The silicon oxynitride film can be formed by CVD using dichlorosilane, ammonium and dinitrogen monoxide ($N_2O$) as raw material gas.

Figure 8A:
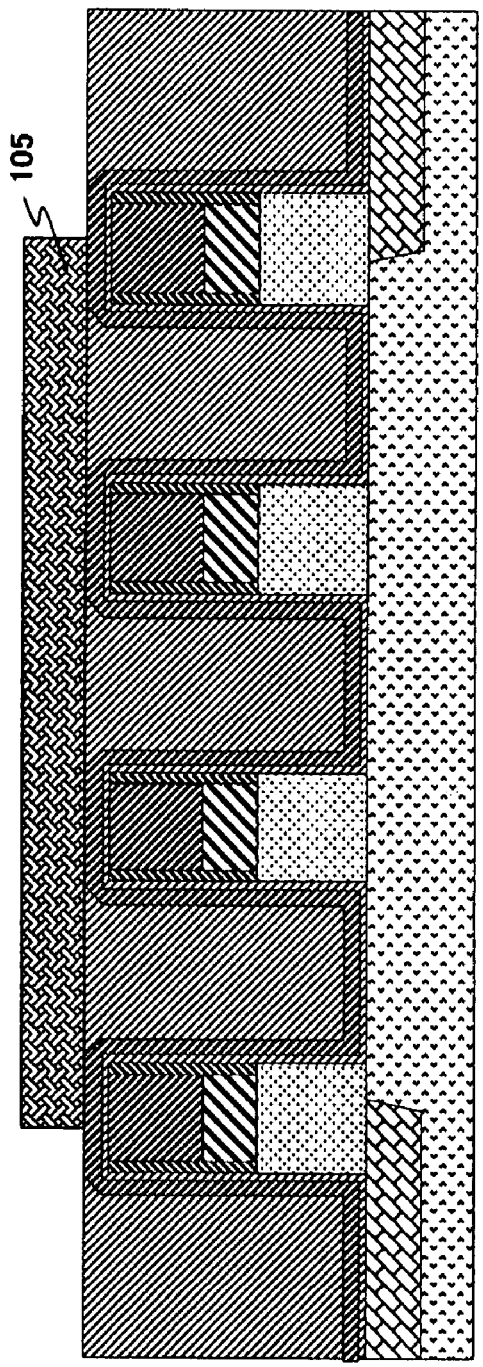
FIG. 8A is a cross-sectional view taken along the direction X-X subsequent to FIG. 7A and explains how to form contact plugs according to the present invention.
Figure 8B:
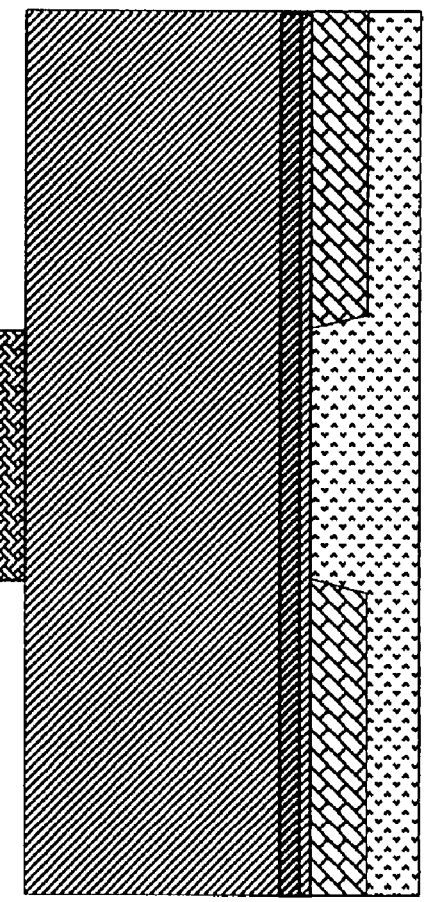
FIG. 8B is a cross-sectional view taken along the direction Y-Y subsequent to FIG. 7B and explains how to form contact plugs according to the present invention.
Figure 9:
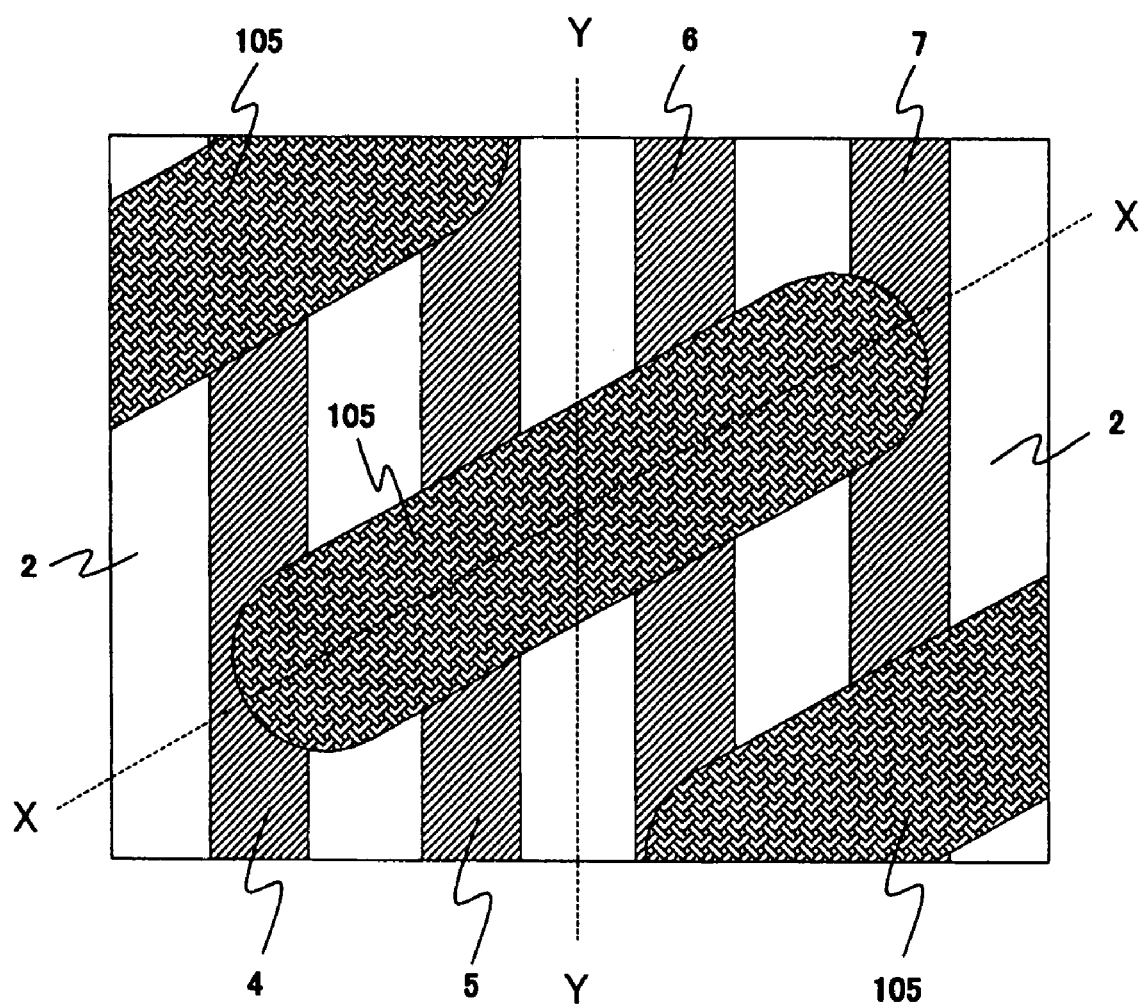
FIG. 9 is a plan view for explaining the position of a photoresist pattern shown in FIGS. 8A and 8B.

Then, as shown in FIGS. 8A and 8B, lithography is used to form a photoresist mask 105. FIG. 9 shows a plan layout diagram of the pattern of the photoresist mask 105 shown in FIG. 8. The pattern of the photoresist mask over the word lines 4, 5, 6 and 7 is the same as that of the active regions surrounded by the element isolation region 2 (see FIG. 2) and disposed such that the pattern of the photoresist mask overlies the pattern of the active regions.

Figure 10A:
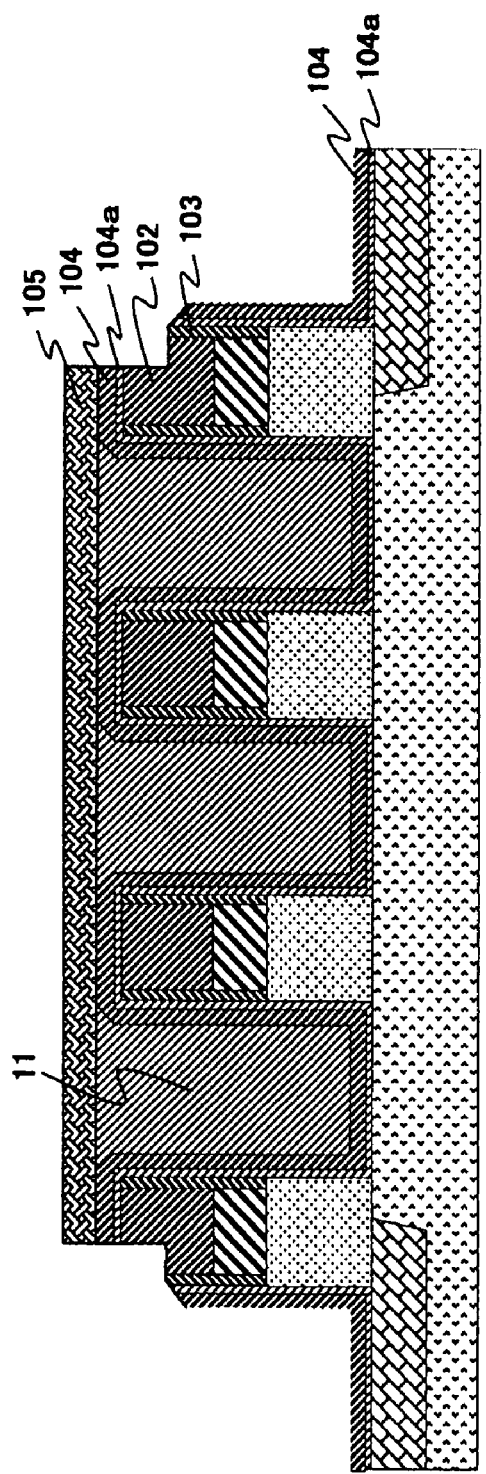
FIG. 10A is a cross-sectional view taken along the direction X-X subsequent to FIG. 8A and explains how to form contact plugs according to the present invention.
Figure 10B:
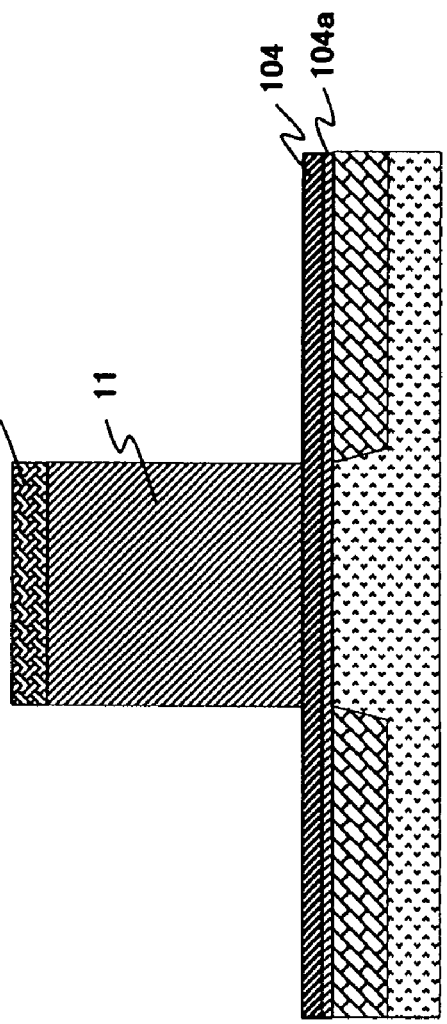
FIG. 10B is a cross-sectional view taken along the direction Y-Y subsequent to FIG. 8B and explains how to form contact plugs according to the present invention.

Thereafter, as shown in FIGS. 10A and 10B, dry etching is used to etch the insulating film 11 in the area other than the area where the pattern of the photoresist mask has been formed. In this etching process, octafluorocyclopentane ($C_5F_8$) is used as primary etching gas and the pressure is 40 mTorr. Since the ratio of the etching rate of the insulating film 11 to the etching rate of the silicon nitride film is about three at maximum, part of the first silicon nitride film 104, silicon oxide film 104a and silicon nitride films 103 and 102 situated above the word lines at both ends that lie off the pattern of the photoresist mask 105 are also etched at the same time. However, the etched portions will not cause the problem of short circuit between the word lines and contact plugs, because no contact plug is formed in these portions. In this dry etching process, the photoresist mask 105 may not be sufficient as an etching mask in some cases. In this case, a silicon film, an amorphous carbon film or the like can be formed and used as a hard mask. For example, a silicon film can be formed before the photoresist mask 105 is formed, and the photoresist mask is used to etch the silicon film so as to process the silicon film into the same pattern as that of the photoresist mask. Then, the resultant silicon film can be effectively used as a mask.

Figure 11A:
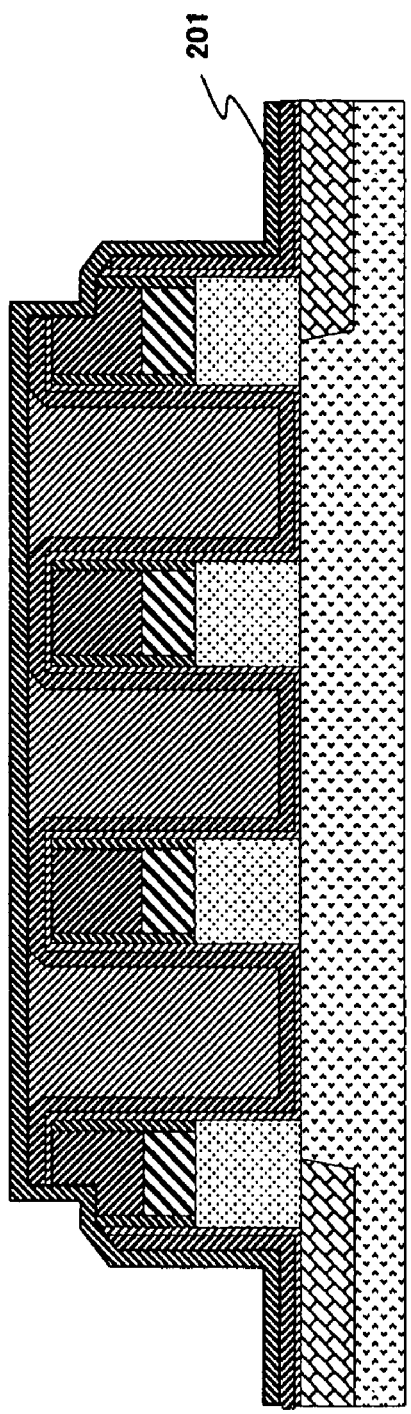
FIG. 11A is a cross-sectional view taken along the direction X-X subsequent to FIG. 10A and explains how to form contact plugs according to the present invention.
Figure 11B:
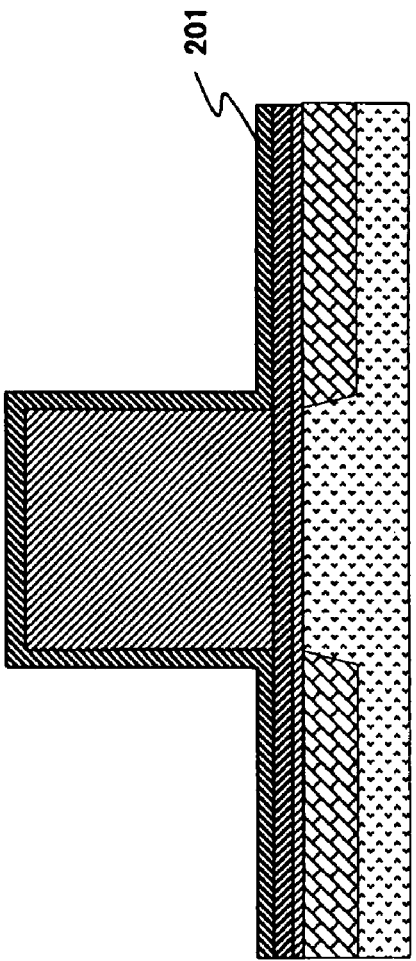
FIG. 11B is a cross-sectional view taken along the direction Y-Y subsequent to FIG. 10B and explains how to form contact plugs according to the present invention.

Then, as shown in FIGS. 11A and 11B, after the photoresist mask 105 is removed, known CVD using dichlorosilane and ammonium as raw material gas is used to deposit a 30 nm-thick second silicon nitride film 201 over the surface.

Figure 12A:
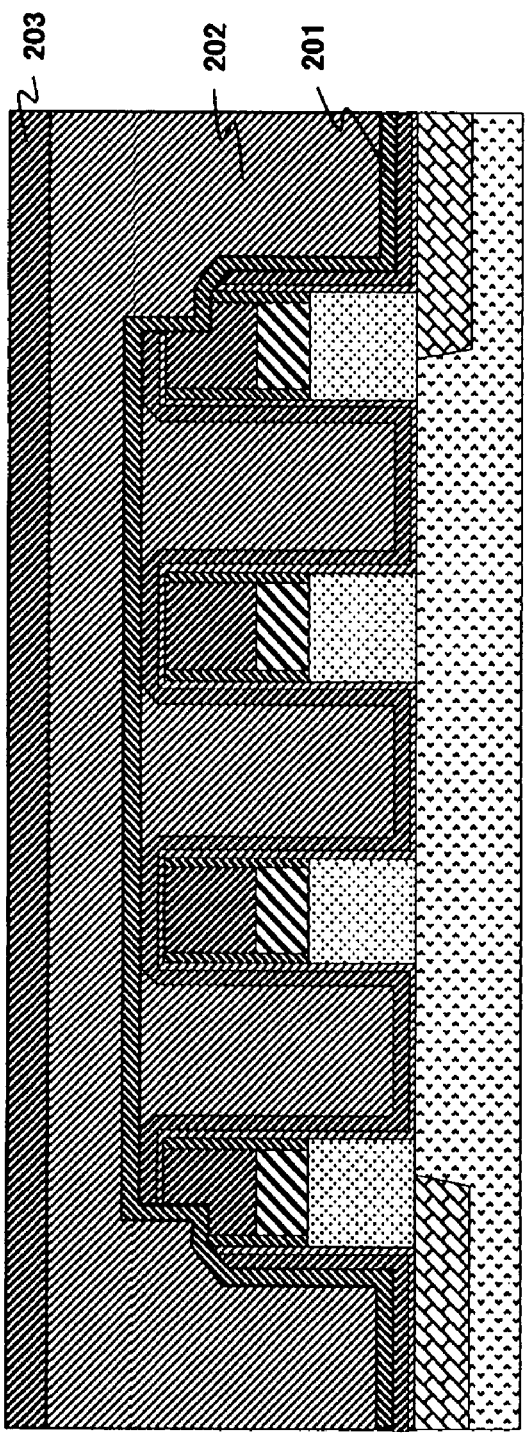
FIG. 12A is a cross-sectional view taken along the direction X-X subsequent to FIG. 11A and explains how to form contact plugs according to the present invention.
Figure 12B:
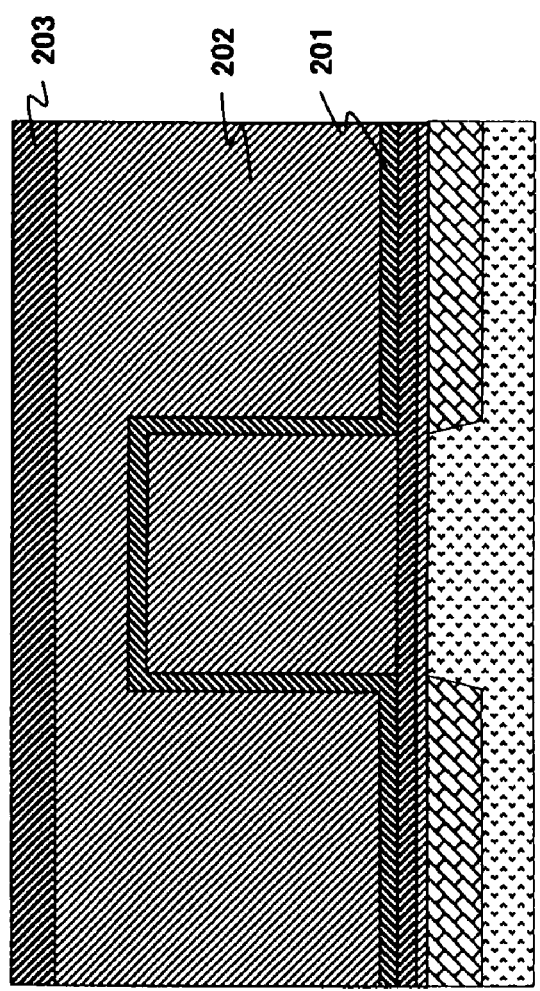
FIG. 12B is a cross-sectional view taken along the direction Y-Y subsequent to FIG. 11B and explains how to form contact plugs according to the present invention.

Thereafter, as shown in FIGS. 12A and 12B, a 600 nm-thick interlayer insulating film 202 made of BPSG is deposited. Then, the resultant structure undergoes heat treatment in a steam atmosphere at 750° C. to fluidize and planarize the surface of the interlayer insulating film 202. Thereafter, CMP method is used to planarize the surface of the interlayer insulating film 202. Then, plasma CVD using monosilane and ammonium as raw material gas is used to deposit a 60 nm-thick third silicon nitride film 203.

Then, as shown in FIGS. 13A and 13B, lithography is used to form another photoresist mask 105 having contact hole patterns 12a, 13a and 14a. These contact hole patterns correspond to the contact hole patterns 12a, 13a and 14a shown in the plan view of FIG. 2.

Figure 14A:
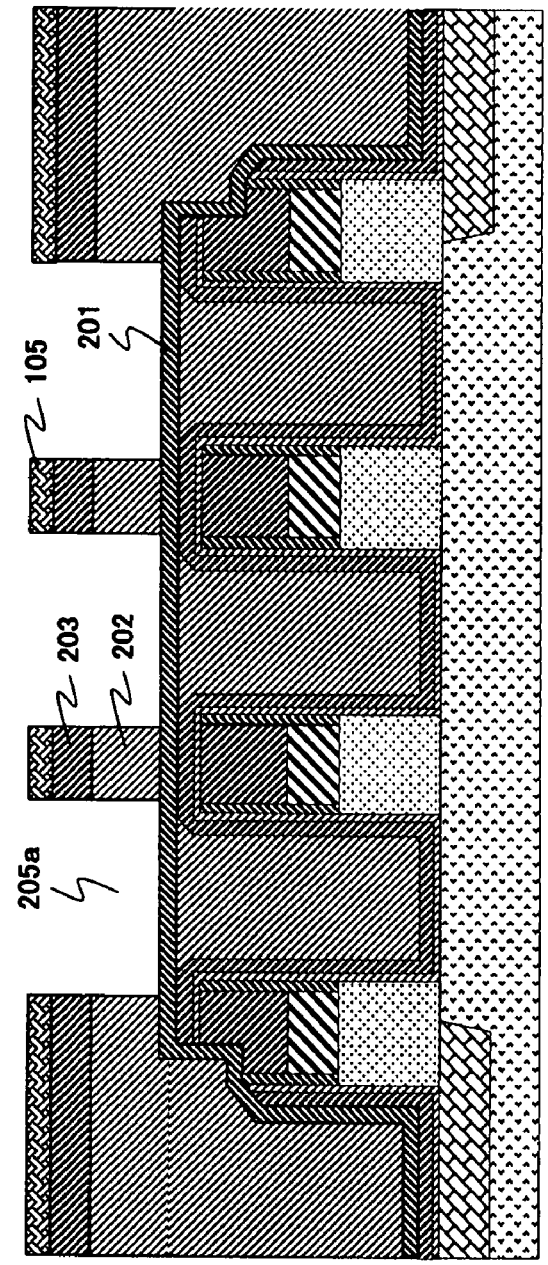
FIG. 14A is a cross-sectional view taken along the direction X-X subsequent to FIG. 13A and explains how to form contact plugs according to the present invention.
Figure 14B:
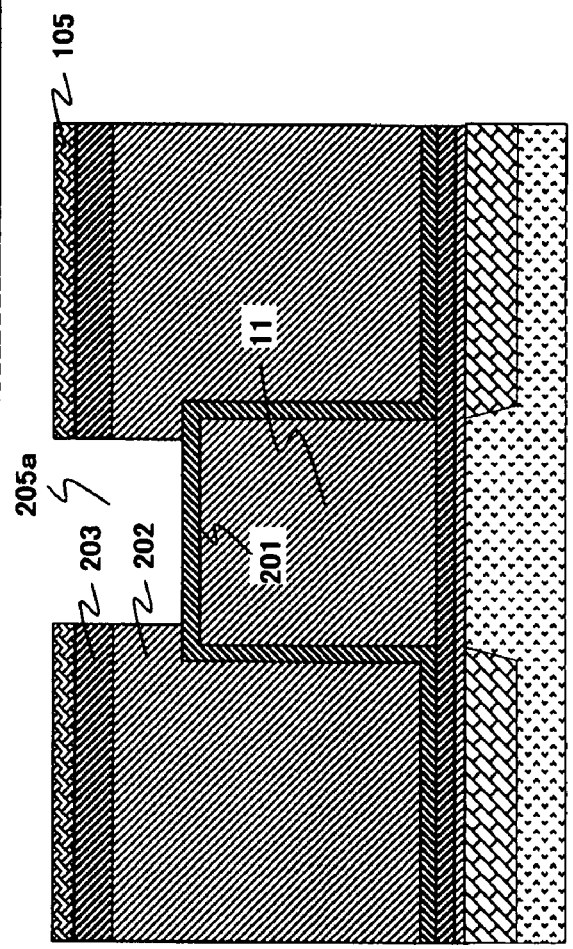
FIG. 14B is a cross-sectional view taken along the direction Y-Y subsequent to FIG. 13B and explains how to form contact plugs according to the present invention.

Thereafter, as shown in FIGS. 14A and 14B, the photoresist mask 105 is used to dry etch the third silicon nitride film 203 and the interlayer insulating film 202 so as to expose the surface of the second silicon nitride film 201 and form first contact holes 205a. In this process, when the contact hole patterns 12a, 13a and 14a lie off the pattern of the photoresist mask 105 shown in FIG. 9 corresponding to the active regions in the vertical direction (direction of the line Y-Y), the contact hole patterns 12a, 13a and 14a will lie off the second silicon nitride film 201 situated on the top surface of the insulating film 11 in FIG. 14B in the lateral direction, disadvantageously resulting in deep grooves that reach the semiconductor substrate. Therefore, in the present invention, the diameters of the contact hole patterns 12a, 13a and 14a are preferably smaller than the length (width) of the pattern of the photoresist mask 105 shown in the plan view of FIG. 9 in the direction perpendicular to the longitudinal direction and disposed in the area where the pattern of the photoresist mask 105 has been formed without lying off the mask pattern.

Then, as shown in FIGS. 15A and 15B, after the photoresist mask 105 is removed, CVD using dichlorosilane and ammonium as raw material gas is used to deposit a 30 nm-thick fourth silicon nitride film 204.

Figure 16A:
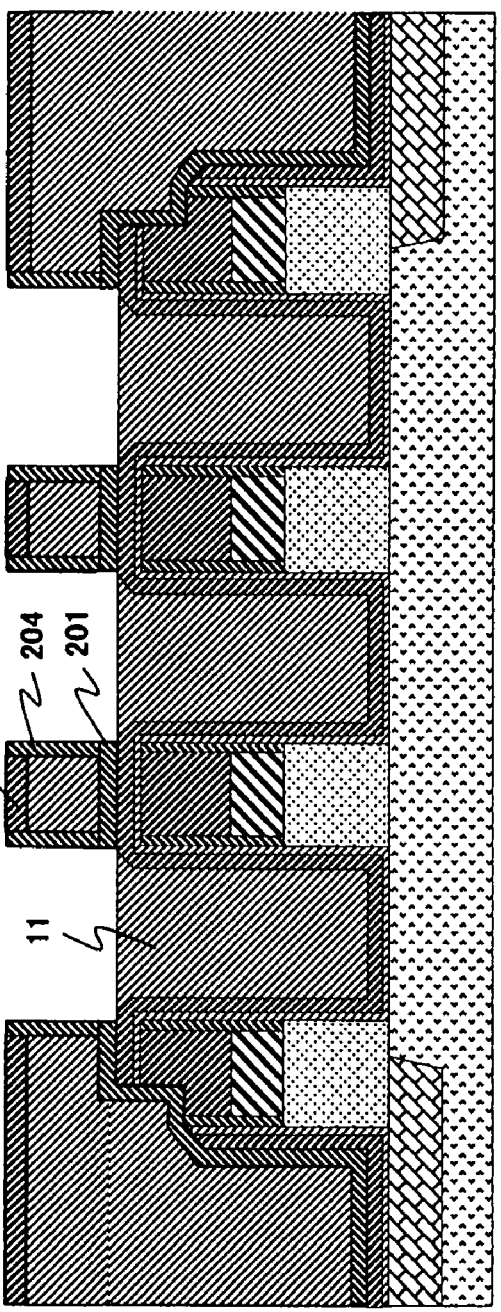
FIG. 16A is a cross-sectional view taken along the direction X-X subsequent to FIG. 15A and explains how to form contact plugs according to the present invention.
Figure 16B:
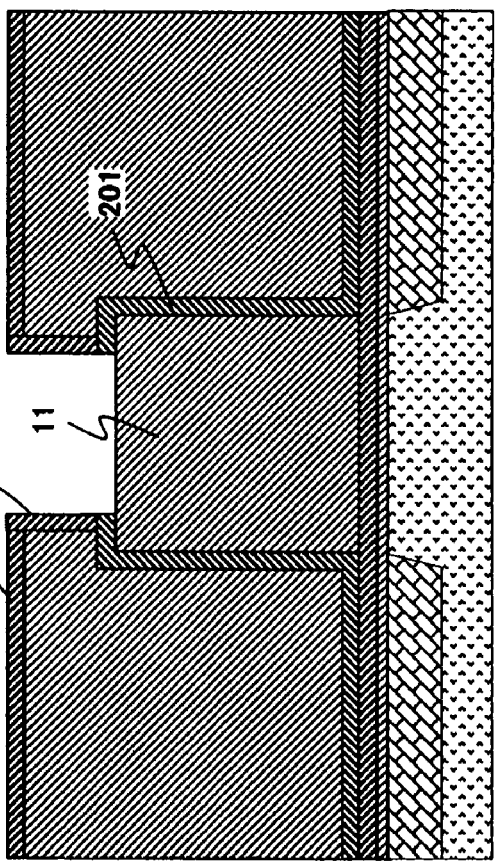
FIG. 16B is a cross-sectional view taken along the direction Y-Y subsequent to FIG. 15B and explains how to form contact plugs according to the present invention.

Thereafter, as shown in FIGS. 16A and 16B, dry etching using fluorine-containing plasma is used to etch back the fourth silicon nitride film 204 and the second silicon nitride film 201 so as to expose the surface of the insulating film 11 formed of the BPSG film. In this process, although the third silicon nitride film 203 situated on the top is also etched back, the initial thickness of 60 nm ensures that an about 30 nm-thick silicon nitride film is left.

Figure 17A:
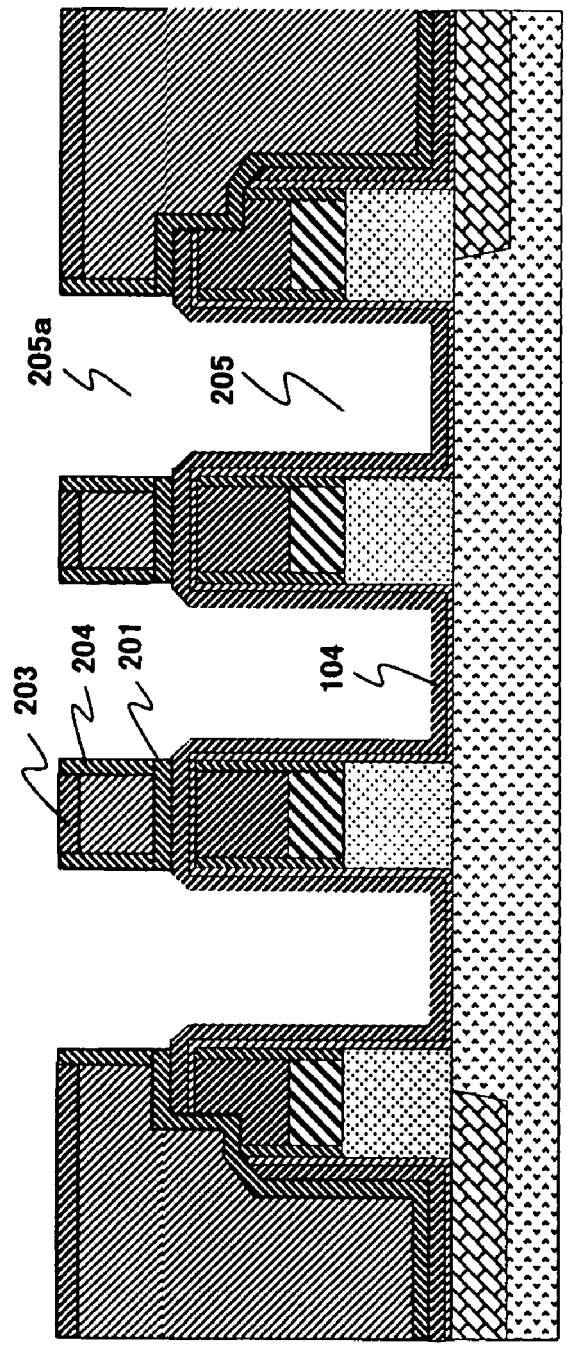
FIG. 17A is a cross-sectional view taken along the direction X-X subsequent to FIG. 16A and explains how to form contact plugs according to the present invention.
Figure 17B:
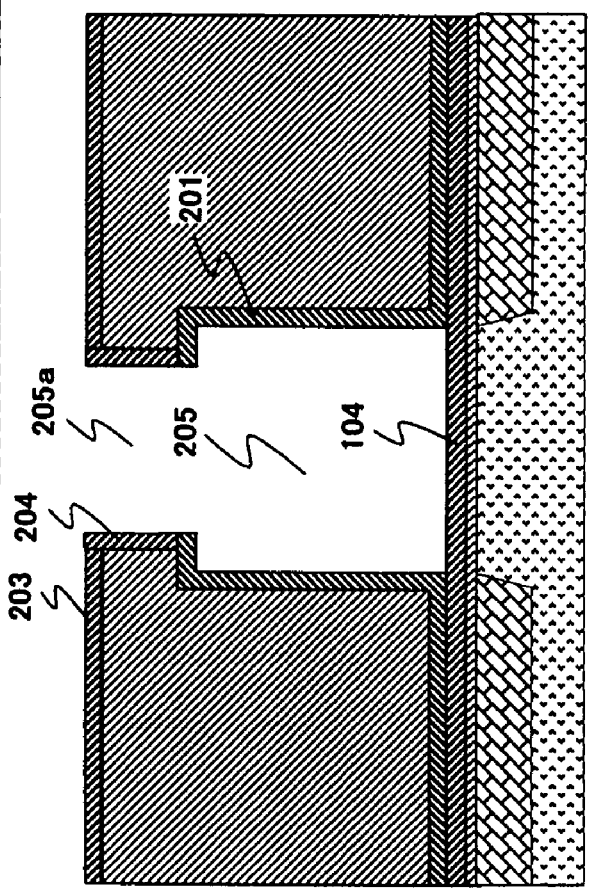
FIG. 17B is a cross-sectional view taken along the direction Y-Y subsequent to FIG. 16B and explains how to form contact plugs according to the present invention.

Then, as shown in FIGS. 17A and 17B, a hydrofluoric acid-containing solution is used to etch the insulating film 11 formed of the BPSG film so as to form second contact holes 205 that are situated under the first contact holes 205a and communicate therewith. In this etching stage, since the side and bottom surfaces as well as other surfaces of the insulating film 11 are all covered with silicon nitride films that are etched by the hydrofluoric acid-containing solution at a slow etching rate, only the insulating film 11 formed of the BPSG film can be selectively removed. In this process, as the hydrofluoric acid-containing solution, BHF (Buffered HF) obtained by solving 113 g of $NH_4F$ (40% ammonium fluoride solution) in 28 ml of HF (50% hydrofluoric acid) and 170 ml of $H_2O$ is used. When such a solution is used, the silicon nitride film will be etched by only 1.5 nm during the etching of the insulating film 11 formed of the 300 nm-thick BPSG film. Therefore, the difference in etching rate is used to allow selective removal of the insulating film 11. Although the BPSG film is used for the insulating film 11 in this embodiment, even a silicon oxide film that contains no B (boron) or P (phosphorus) can achieve similarly large difference in etching rate. It is known that the etching rate of a BPSG film differs from that of a silicon nitride film.

Figure 18A:
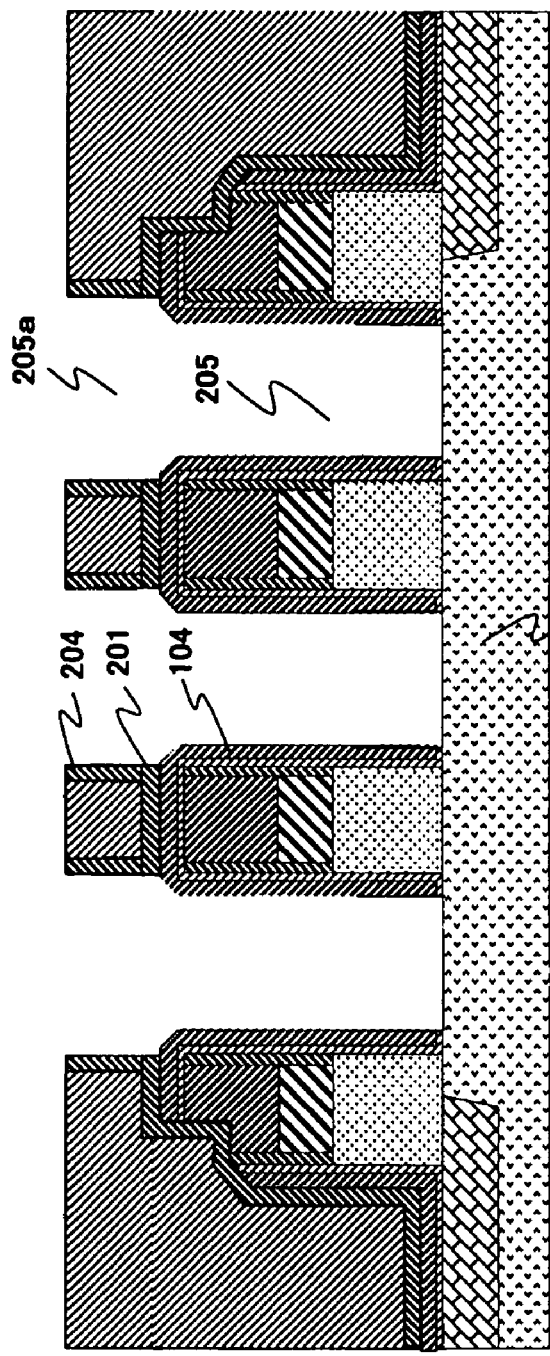
FIG. 18A is a cross-sectional view taken along the direction X-X subsequent to FIG. 17A and explains how to form contact plugs according to the present invention.
Figure 18B:
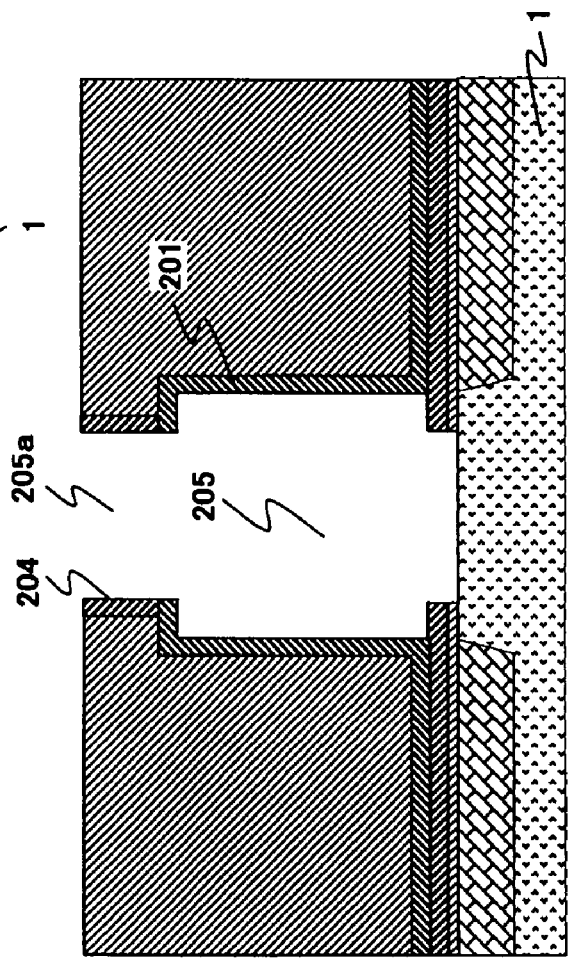
FIG. 18B is a cross-sectional view taken along the direction Y-Y subsequent to FIG. 17B and explains how to form contact plugs according to the present invention.

Thereafter, as shown in FIGS. 18A and 18B, dry etching using fluorine-containing plasma is used to etch the first silicon nitride film 104 that is exposed at the bottom of the contact holes and the silicon oxide film 104a that is situated on the semiconductor substrate 1, so as to expose the surface of the semiconductor substrate. Before or after the first silicon nitride film 104 and the silicon oxide film 104a are etched, ion implantation may be used to form desired impurity diffusion layers on the surface of the semiconductor substrate 1.

Figures 19A, 19B:
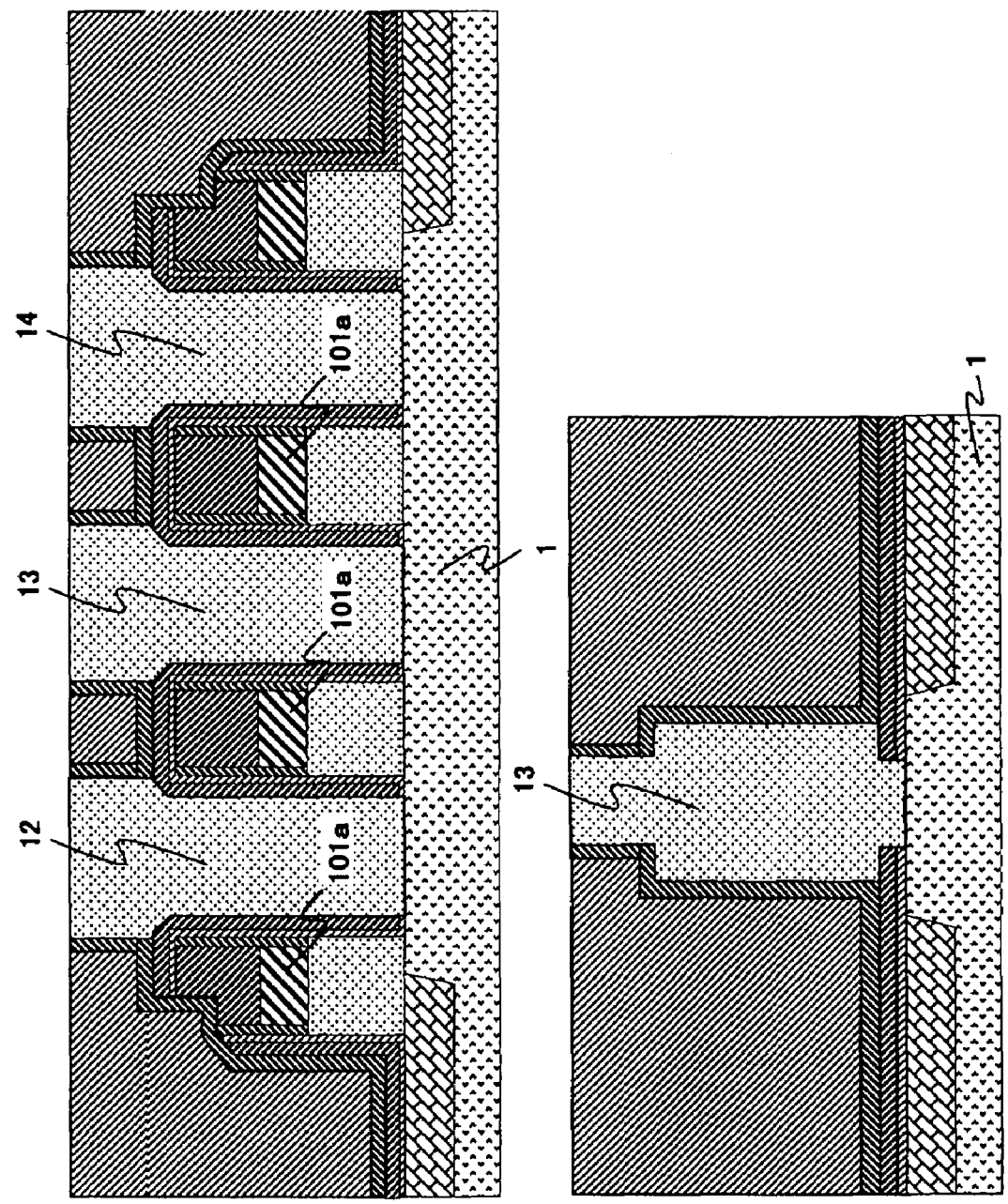
FIG. 19A is a cross-sectional view taken along the direction X-X subsequent to FIG. 18A and explains how to form contact plugs according to the present invention.
FIG. 19B is a cross-sectional view taken along the direction Y-Y subsequent to FIG. 18B and explains how to form contact plugs according to the present invention.

Then, as shown in FIGS. 19A and 19B, after a hydrofluoric acid-containing solution is used to clean the surface of the semiconductor substrate, CVD is used to form a phosphorus-containing silicon film such that the first contact holes 205a and the second contact holes 205 are filled. Thereafter, CMP method is used to remove the silicon film formed on the surface of the interlayer insulating film 202 so as to form contact plugs 12, 13 and 14. Subsequently, as shown in FIG. 1, formation of a bit line, formation of capacitors, formation of wiring lines and the like can be performed to form a DRAM.

According to this embodiment, since the contact holes to be formed between the word lines are formed by wet etching, it is possible to prevent the shoulders of the top insulating films that form the word lines to be scraped, thereby eliminating the problem of short circuit between the contact plugs 12, 13, 14 and the tungsten layers 101a that form the word lines.

Alternatively, in the stage shown in FIGS. 18A and 18B, after a silicon nitride film or a silicon oxide film is further formed over the surface and etched back so as to form sidewall layers of the silicon nitride film or the silicon oxide film on the sidewalls of the contact holes, ion implantation is used to form impurity diffusion layers on the surface of the semiconductor substrate, and then the contact plugs can be formed.

What is claimed is:

1. A method for manufacturing a semiconductor device comprising:
   providing a semiconductor substrate in which an element isolation region and active regions surrounded by the element isolation region are formed;
   forming a plurality of conductive lines disposed such that the conductive lines cross the active regions;
   forming a first insulating film over the entire surface including the conductive lines;
   etching away the first insulating film situated over the active regions between the conductive lines so as to form contact holes,
     wherein after an anti-etching film is formed to protect surfaces in the contact holes, wet etching is conducted to remove the first insulating film in the contact holes so as to form the contact holes;
   after the conductive lines are formed and before the first insulating film is formed, forming a first silicon nitride film over the entire surface including the conductive lines, the active regions and the element isolation region;
   after the first insulating film is formed, removing the first insulating film until surfaces of the first silicon nitride films situated over top surfaces of the conductive lines are exposed;

after removing the first insulating film until the surfaces of the first silicon nitride films are exposed, forming a first resist mask including resist portions that are formed such that the resist portions are separately disposed corresponding to the active regions and cover contact hole formation regions in the active regions;

removing the first insulating film over the element isolation region by dry etching using the first resist mask;

after the first resist mask is removed, forming a second silicon nitride film over the entire surface;

forming a second insulating film over the second silicon nitride film and planarizing a surface of the second insulating film;

forming a third silicon nitride film on the planarized second insulating film;

forming a second resist mask having openings disposed at predetermined positions over the active regions;

dry etching the third silicon nitride film and the second insulating film using the second resist mask to form first contact holes and expose the surface of the second silicon nitride film in the holes;

after the second resist mask is removed, forming a fourth silicon nitride film over the entire surface;

dry etching the fourth silicon nitride film and the second silicon nitride film situated at the bottoms of the first contact holes to expose the surface of the first insulating film in the holes;

removing the first insulating film whose surface is exposed in the first contact holes by wet etching so as to form second contact holes that are situated under the first contact holes and communicate therewith; and dry etching the first silicon nitride film exposed at the bottoms of the second contact holes so as to expose surfaces of the active regions.

2. The method for manufacturing a semiconductor device according to claim 1, wherein removing the first insulating film until the surface of the first silicon nitride film is exposed is carried out by polishing to planarize the surface of the first insulating film.

3. The method for manufacturing a semiconductor device according to claim 1, wherein the first resist mask has the same pattern as a pattern of the active regions and is disposed such that the first resist mask overlies the pattern of the active regions.

4. The method for manufacturing a semiconductor device according to claim 1, wherein the diameters of the openings in the second resist mask for forming the first contact holes are smaller than a length of the first resist mask in a direction perpendicular to a longitudinal direction.

5. The method for manufacturing a semiconductor device according to claim 1, further comprising filling the first contact holes and the second contact holes with conductive material to form contact plugs.

* * * * *